(12) United States Patent
Zhou

(10) Patent No.: US 11,094,770 B2
(45) Date of Patent: Aug. 17, 2021

(54) ARRAY SUBSTRATE AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Yang Zhou, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 16/639,755

(22) PCT Filed: Jan. 8, 2020

(86) PCT No.: PCT/CN2020/070793
§ 371 (c)(1),
(2) Date: Feb. 18, 2020

(87) PCT Pub. No.: WO2021/031512
PCT Pub. Date: Feb. 25, 2021

(65) Prior Publication Data
US 2021/0057501 A1 Feb. 25, 2021

(51) Int. Cl.
*H01L 27/32* (2006.01)
*H01L 51/00* (2006.01)

(52) U.S. Cl.
CPC ...... *H01L 27/3276* (2013.01); *H01L 27/3272* (2013.01); *H01L 51/0097* (2013.01)

(58) Field of Classification Search
None
See application file for complete search history.

(56) References Cited

U.S. PATENT DOCUMENTS

| 10,224,344 B2 | 3/2019 | Lee et al. |
| 2017/0170206 A1* | 6/2017 | Lee ................. H01L 29/78633 |
| 2018/0013079 A1* | 1/2018 | Cai .................... H01L 51/0097 |
| 2018/0197935 A1 | 7/2018 | Yuan et al. |
| 2019/0012031 A1* | 1/2019 | Kim ..................... G06F 3/0412 |
| 2021/0057501 A1* | 2/2021 | Zhou .................. H01L 51/0097 |

FOREIGN PATENT DOCUMENTS

| CN | 104934438 A | 9/2015 |
| CN | 108054188 A | 5/2018 |
| CN | 108336099 A | 7/2018 |
| CN | 109994606 A | 7/2019 |

* cited by examiner

*Primary Examiner* — J. E. Schoenholtz
(74) *Attorney, Agent, or Firm* — Mark M. Friedman

(57) ABSTRACT

An array substrate and a display panel are provided. The display panel includes the array substrate. A bending region and a non-bending region are defined in the array substrate. The non-bending region includes a flexible substrate layer, a composite buffer layer, a source drain layer, a flattening layer and a pixel definition layer that are laminated one another. The bending region includes the flexible substrate layer, the source drain layer, the flattening layer and the pixel definition layer that are laminated one another. Alternatively, thickness of the composite buffer layer located in the bending region is less than thickness of the composite buffer layer located in the non-bending region.

9 Claims, 4 Drawing Sheets

ARRAY SUBSTRATE AND DISPLAY PANEL

FIELD OF THE DISCLOSURE

The present invention relates to display technologies, and more particularly to an array substrate and a display panel.

DESCRIPTION OF RELATED ARTS

With the booming industries of organic light emitting diodes (OLEDs), foldable products are getting into a prosperous development. Amongst, bending technologies have become a bottleneck, restricting a further development of the products.

FIG. 1 is a structural schematic diagram showing a bent array substrate according to an existing art. As shown in FIG. 1, the array substrate 90 includes a bending region 91 and a non-bending region 92. The array substrate 90 includes a flexible substrate layer 901, a composite buffer layer 902, a source drain layer 903, a flattening layer 904 and a pixel definition layer 905 that are laminated one another. After bent, the thickness of the array substrate 90 in the bending region 91 is generally 12-20 um. The thickness of metal lines (i.e., the source drain layer 903) located in the bending region 91 is generally 0.6-1 um and the thickness of film layers located above the metal lines is generally 3-4 um. A dashed line shown in FIG. 1 indicates a stress balance line (also called a neutral face) 93 presented after the array substrate 90 is bent. The stress balance line 93 refers to a place not only suffering no compressive stress but also suffering no tensile stress when the array substrate 100 is bent. The stress at that place is zero. However, after bending the array substrate 90, the stress balance line 93 is at a lower side of the source drain layer. In such a way, the metal lines located in the bending region will be suffered by stress such that they are easily to be cracked or broken.

In the existing art, to solve above problem, bending angles are usually symmetrical to each other and smooth when the bending region is bent. However, the bending angles are actually not presented with ideal state due to affection caused by insufficient bending process ability or interference with external forces. Inward deformation or lateral shift of the bending angles may occur. As a result, the stress of the source drain layer of the bending region is concentrated and enlarged, thereby causing cracks or breakage. The extension of cracks may penetrate the whole cross section of a circuit, causing a failure of signal transmission and resulting in abnormal image displaying.

If the cracks of a circuit or trace are not avoided, the product yield cannot be guaranteed and mass production will not be feasible. Therefore, there is a need to provide a new array substrate and display panel to overcome the problems in the existing arts.

Technical Problems

The objective of the present invention is to provide an array substrate and a display panel. By reducing the distance between metal lines and a substrate, a source drain layer is close to or even reaches a stress balance line such that the stress on the metal lines themselves is reduced or basically no stress is generated. If the metal lines suffer no stress, a risk of breakage of them is lowered and an ability of the screen to endure the bending is improved.

Technical Solutions

To achieve above objective, an embodiment of the present invention provides an array substrate. A bending region and a non-bending region are defined in the array substrate. The non-bending region includes a flexible substrate layer, a composite buffer layer, a source drain layer, a flattening layer and a pixel definition layer that are laminated one another. Specifically speaking, the composite buffer layer is located on the flexible substrate layer; the source drain layer is located on the composite buffer layer; the flattening layer is located on the source drain layer; the pixel definition layer is located on the flattening layer. The bending region includes the flexible substrate layer, the source drain layer, the flattening layer and the pixel definition layer that are laminated one another. Specifically speaking, the source drain layer is located on the flexible substrate layer; the flattening layer is located on the source drain layer; the pixel definition layer is located on the flattening layer.

Further an organic layer is provided at a side of the composite buffer layer corresponding to the bending region; the non-bending region further includes the organic layer, the organic layer is adjacent to the bending region, a part of the organic layer covers the composite buffer layer and another part of the organic layer is formed on the flexible substrate layer.

Further, the source drain layer covers the organic layer.

Further, a material of the organic layer includes oxidative dehydrogenated organic substance, polyimide resin or siloxane.

Further, the composite buffer layer includes a buffer layer and a shielding layer that are laminated one another. Specifically speaking, the buffer layer is located on the flexible substrate layer; the shielding layer is located on the buffer layer; the source drain layer is located on the shielding layer.

Further, a material of the flexible substrate layer is polyimide.

Further, the array substrate includes a supporting layer located on the pixel definition layer.

Further, the array substrate includes a light emitting layer on the pixel definition layer in the non-bending region.

Another embodiment of the present invention provides an array substrate. A bending region and a non-bending region are defined in the array substrate. The array substrate includes a flexible substrate layer, a composite buffer layer, a source drain layer, a flattening layer and a pixel definition layer that are laminated one another. Specifically speaking, the composite buffer layer is located on the flexible substrate layer; the source drain layer is located on the composite buffer layer; the flattening layer is located on the source drain layer; the pixel definition layer is located on the flattening layer. Thickness of the composite buffer layer located in the bending region is less than thickness of the composite buffer layer located in the non-bending region.

Still another embodiment of the present embodiment provides a display panel including any of the afore-described array substrate.

BENEFICIAL EFFECTS

The beneficial effects of the present invention are described below. An array substrate and a display panel are provided. By reducing the distance between metal lines and a substrate, a source drain layer is close to or even reaches a stress balance line such that the stress suffered by the metal lines is reduced or basically the metal lines suffer no stress themselves. If the metal lines suffer no stress, a risk of breakage of them is lowered and an ability of the screen to endure the bending is improved.

Figure 1:
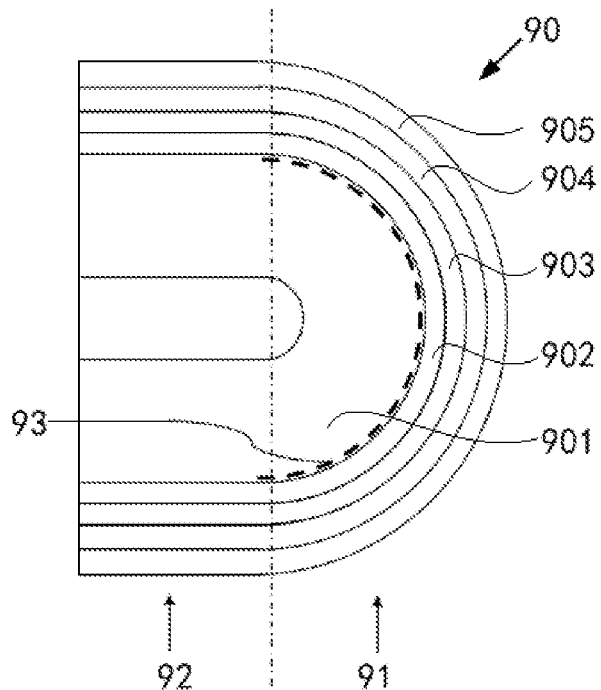
FIG. 1 is a structural schematic diagram showing a bent array substrate according to an existing art.

1 flexible substrate layer; 2 source drain layer; 4 flattening layer 5 pixel definition layer; 6 supporting layer; 8 organic layer 10 bending region; 20 non-bending region; 21 buffer layer; 22 shielding layer 30 stress balance line; 100 array substrate

DESCRIPTION OF EMBODIMENTS OF THE DISCLOSURE

In the description of the present invention, it is to be understood that the terms "center", "longitudinal", "lateral", "length", "width", "thickness", "upper", "lower", "front", "rear", "left", "right", "vertical", "horizontal", "top", "bottom", "inner", "outer", "clockwise", "counterclockwise" and the like indicated orientation or positional relationship are based on the relationship of the position or orientation shown in the drawings, which is only for the purpose of facilitating description of the present invention and simplifying the description, but is not intended to or implied that the device or element referred to must have a specific orientation, and be constructed and operated in a particular orientation. Therefore, it should not be construed as a limitation of the present invention. In addition, the terms "first" and "second" are used for descriptive purposes only, and should not be taken to indicate or imply relative importance, or implicitly indicate the indicated number of technical features. Thus, by defining a feature with "first" or "second", it may explicitly or implicitly include one or more features. In the description of the present invention, "a plurality" means two or more unless explicitly defined.

In the present application, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Embodiment 1

Figure 2:
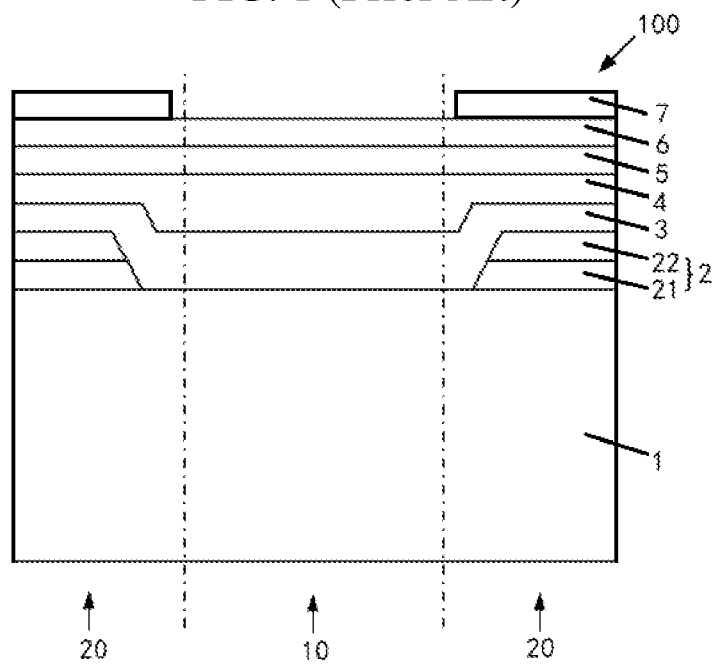
FIG. 2 is a structural schematic diagram showing an array substrate according to a first embodiment of the present invention.
Figure 3:
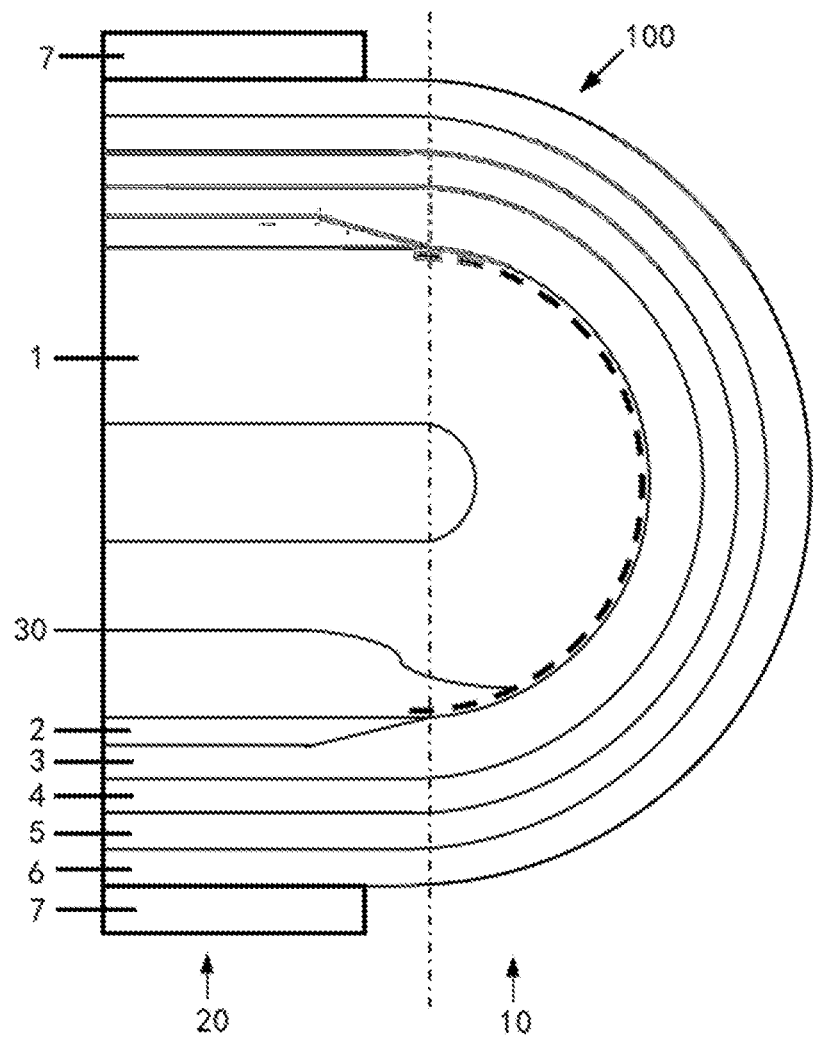
FIG. 3 is a structural schematic diagram showing the array substrate in FIG. 2 after being bent.

As shown in FIGS. 2 and 3, an array substrate 100 is provided in a first embodiment of the present invention. A bending region 10 and a non-bending region 20 are defined in the array substrate 100. The non-bending region 20 includes a flexible substrate layer 1, a composite buffer layer 2, a source drain layer 3, a flattening layer 4 and a pixel definition layer 5 that are laminated one another. Specifically speaking, as shown in FIG. 2, the composite buffer layer 2 is located on the flexible substrate layer 1; the source drain layer 3 is located on the composite buffer layer 2; the flattening layer 4 is located on the source drain layer 3; the pixel definition layer 5 is located on the flattening layer 4. The bending region 10 includes the flexible substrate layer 1, the source drain layer 3, the flattening layer 4 and the pixel definition layer 5 that are laminated one another. Specifically speaking, the source drain layer 3 is located on the flexible substrate layer 1; the flattening layer 4 is located on the source drain layer 3; the pixel definition layer 5 is located on the flattening layer 4.

As shown in FIG. 3, a stress balance line 30 (as indicated by a dashed line in the figure, also called a neutral face) is defined in the array substrate 100 of the present invention. The stress balance line 30 refers to a place not only suffering no compressive stress but also suffering no tensile stress when the array substrate 100 is bent. The bending stress at that place is zero. If located close to the stress balance line 30, metal lines (i.e., the source drain layer 3 for transmitting signals) are not easy to be broken when they are bent.

Accordingly, in the array substrate 100 provided in the present embodiment, the composite buffer layer 2 is not disposed in the bending region 10. Compared to the existing arts, the present invention shifts the source drain layer 3 downward such that the source drain layer 3 is closer to the stress balance line 30, thereby reducing the stretching stress that may be suffered by the source drain layer 3. Moreover, if the source drain layer 3 reaches a place at where the stress balance line 30 is located, stress on the source drain layer 3 will be reduced or even not presented basically. Of course, if the stress suffered by the source drain layer 3 is reduced or not presented, a risk of breakage of the source drain layer 3 is lowered and an ability of the screen to endure the bending is improved, thereby improving bending resistance, lowering a risk of line breakage and increasing service life.

Since the flattening layer 4 and the pixel definition layer 5 that are located above the source drain layer 3 are manufactured by coating on an entire surface, the flattening layer 4 and the pixel definition layer 5 can completely cover a concave region of the source drain layer 3. In this way, the stress balance line 30 is basically remained unchanged. Since the source drain layer 3 is close to the balance line, the stress on the source drain layer 3 is reduced.

In the present embodiment, the composite buffer layer 22 includes a buffer layer 21 and a shielding layer 22 that are laminated one another. Specifically speaking, the buffer layer 21 is located on the flexible substrate layer 1; the shielding layer 22 is located on the buffer layer 21; the source drain layer 3 is located on the shielding layer 22.

In the present embodiment, a material of the flexible substrate layer 1 is polyimide.

In the present embodiment, the array substrate 100 further includes a supporting layer 6 located on the pixel definition layer 5. Disposing the supporting layer 6 can increase upper surface thickness of the array substrate 100 such that the stress balance line 30 is shifted upward. Compared to the existing arts, the source drain layer 3 is further shifted downward and is closer to the stress balance line 30, thereby reducing the stretching stress on the source drain layer 3. The source drain layer 3 may even reach at a place where the stress balance line 30 is located such that the stress suffered by the source drain layer 3 is reduced or basically the source drain layer 3 suffers no stress itself.

In the present embodiment, the array substrate 100 further includes a light emitting layer 7 located on the pixel definition layer 5 in the non-bending region 20.

Embodiment 2

Figure 4:
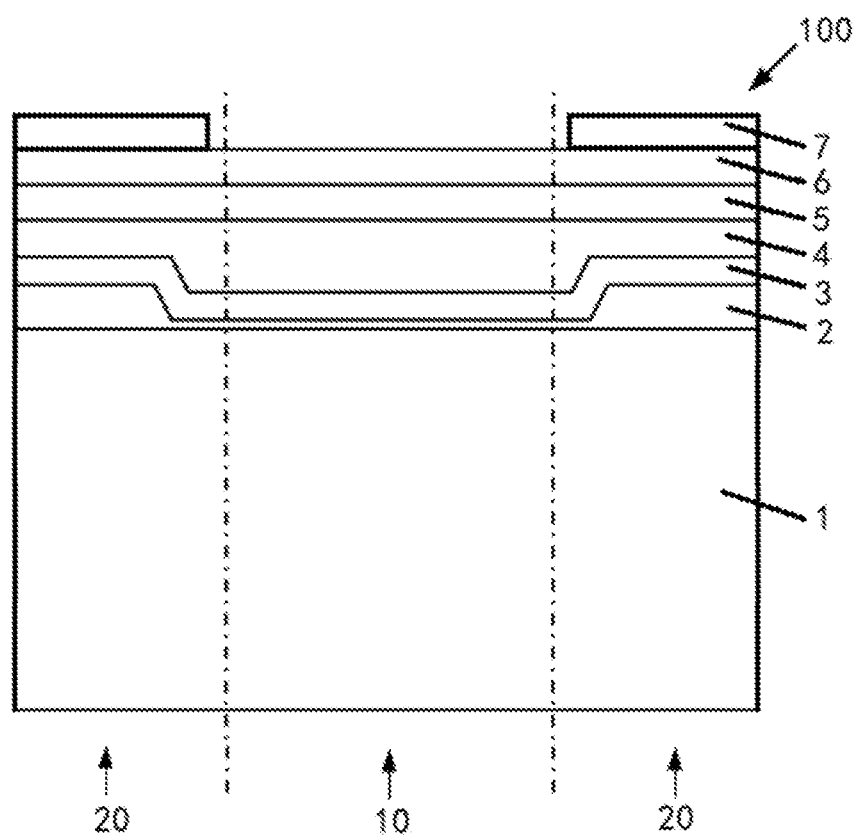
FIG. 4 is a structural schematic diagram showing an array substrate according to a second embodiment of the present invention.
Figure 5:
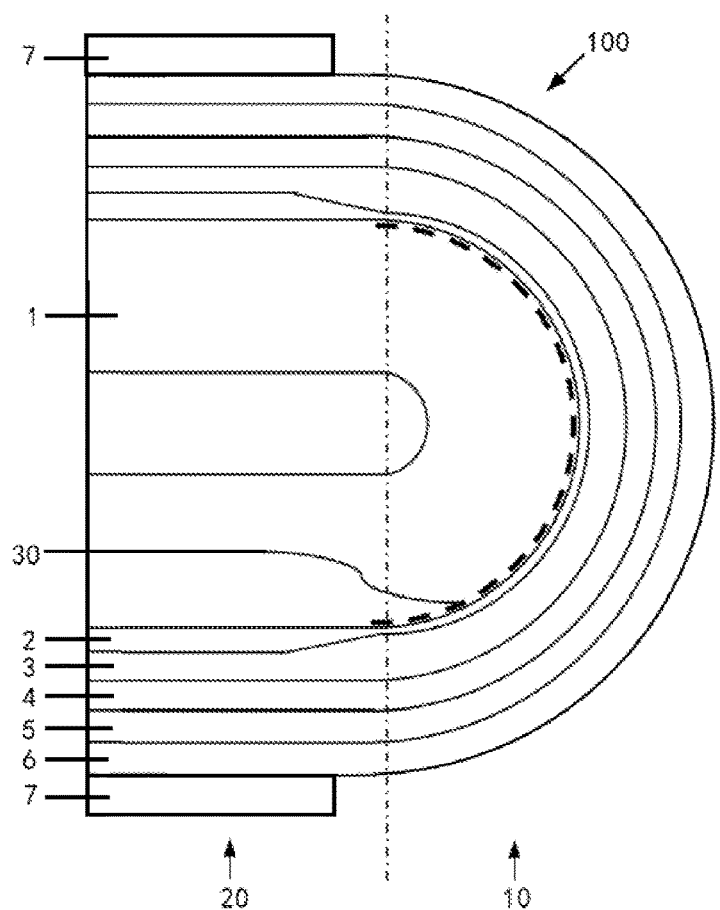
FIG. 5 is a structural schematic diagram showing the array substrate in FIG. 4 after being bent.

As shown in FIGS. 4 and 5, a second embodiment of the present invention provides an array substrate 100 including all the technical features of the first embodiment of the present invention. The difference therebetween is that the composite buffer layer 2 is disposed in the bending region 10 in the array substrate 100 of the second embodiment while the composite buffer layer 2 is not disposed in the bending region 10 in the array substrate 100 of the first embodiment. In the array substrate 100 of the second embodiment, thickness of the composite buffer layer 2 in the bending region 10 is less than that of the composite buffer layer 2 in the non-bending region 20.

The thickness of the composite buffer layer 2 in the bending region 10 in the array substrate 100 provided in the second embodiment is reduced. However, compared to the existing arts, the source drain layer 3 can still be shifted downward and be closer to the stress balance line 30, thereby reducing the stretching stress that may be suffered by the source drain layer 3. The source drain layer 3 may even reach at a place where the stress balance line 30 is located such that the stress suffered by the source drain layer 3 is reduced or basically the source drain layer 3 suffers no stress itself. If the stress suffered by the source drain layer 3 is reduced or not presented, a risk of breakage of the source drain layer 3 is lowered and an ability of the screen to endure the bending is improved, thereby improving bending resistance, lowering a risk of line breakage and increasing service life.

Embodiment 3

Figure 6:
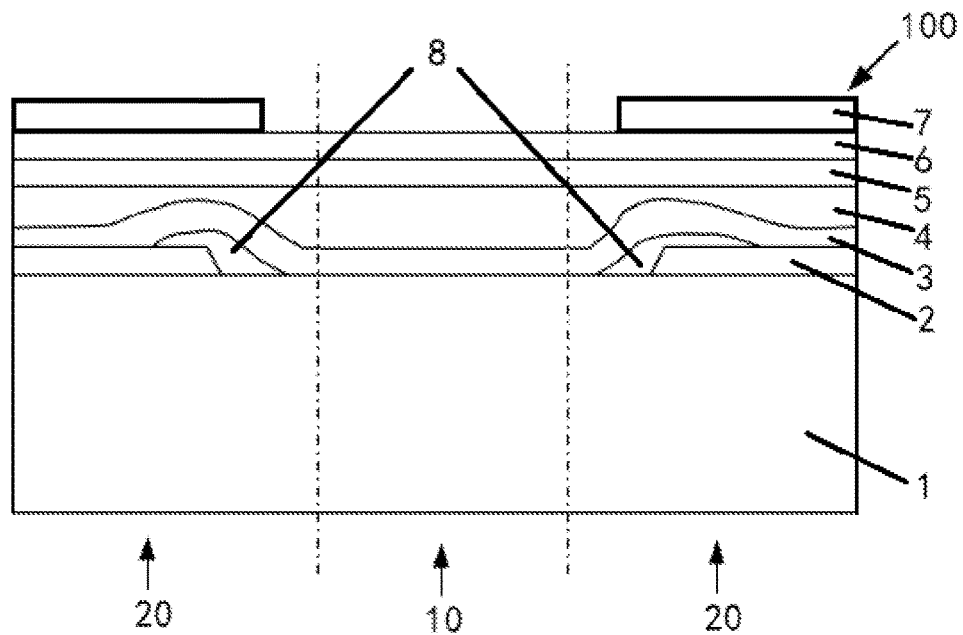
FIG. 6 is a structural schematic diagram showing an array substrate according to a third embodiment of the present invention.

As shown in FIG. 6, a third embodiment of the present invention provides an array substrate 100 including all the technical features of the first embodiment of the present invention. The difference therebetween is that an organic layer 8 is provided in the third embodiment, the organic layer 8 is formed in the non-bending region 20 and is adjacent to the bending region 10. A part of the organic layer 8 covers the composite buffer layer 2 and another part of the organic layer 8 is formed on the flexible substrate layer 1. The source drain layer 3 covers the organic layer 8. In other words, the organic layer 8 is formed at a joint of the composite buffer layer 2 and the bending region 10. The organic layer 8 may function as transition, for buffering the bending region 10 and the non-bending region 20 and avoiding line breakage caused by overlarge stress at an etching edge of the composite buffer layer 2.

In the present embodiment, a material of the organic layer 8 includes oxidative dehydrogenated organic substance, polyimide resin or siloxane. The organic layer 8 is manufactured by coating and a material of the organic layer 8 is preferred to be oxidative dehydrogenated organic substance.

Based on a same inventive concept, one of the embodiments of the present invention provides a display panel including any one of the afore-described array substrates 100.

A display device carried out in the present embodiment can be any product or component having a display function, such as a wearable device, a cell phone, a tablet computer, a television, a display, a notebook computer, an eBook reader, an e-newspaper, a digital photo frame, a navigator and the like. The wearable device includes a smartband, a smartwatch, a virtual reality (VR) device and the like.

The principle of the display panel provided in the present embodiment is consistent with that of the array substrate 100 of the afore-described embodiments. Detailed structure and principle of the display panel refers to the array substrate 100 of the afore-described embodiments, and is not repeated herein.

The beneficial effects of the present invention are described below. An array substrate and a display panel are provided. By reducing the distance between the source drain layer (i.e., metal lines) and the substrate, the source drain layer is close to or even reaches the stress balance line such that the stress suffered by the source drain layer 3 is reduced or basically the source drain layer 3 suffers no stress itself. If the source drain layer suffers no stress, a risk of breakage of the source drain layer is lowered and an ability of the screen to endure the bending is improved.

Above descriptions are preferred embodiments of the present invention. It should be noted that various modifications and alterations can be made by persons skilled in this art without departing from the principles of the present invention, and that all modifications and alterations are within the scope of the present invention.

The invention claimed is:

1. An array substrate, a bending region and a non-bending region defined in the array substrate, the non-bending region comprising:
    a flexible substrate layer;
    a composite buffer layer, located on the flexible substrate layer;
    a source drain layer, located on the composite buffer layer;
    a flattening layer, located on the source drain layer; and
    a pixel definition layer, located on the flattening layer,
    the bending region comprising:
    the flexible substrate layer;
    the source drain layer, located on the flexible substrate layer;
    the flattening layer, located on the source drain layer; and
    the pixel definition layer, located on the flattening layer,
    wherein the array substrate further comprises a light emitting layer on the pixel definition layer in the non-bending region.

2. The array substrate according to claim 1, wherein the non-bending region further comprises an organic layer, the organic layer is adjacent to the bending region, a part of the organic layer covers the composite buffer layer and another part of the organic layer is formed on the flexible substrate layer.

3. The array substrate according to claim 2, wherein the source drain layer covers the organic layer.

4. The array substrate according to claim 2, wherein a material of the organic layer comprises oxidative dehydrogenated organic substance, polyimide resin or siloxane.

5. The array substrate according to claim 1, wherein the composite buffer layer comprises:
    a buffer layer, located on the flexible substrate layer; and
    a shielding layer, located on the buffer layer,
    wherein the source drain layer is located on the shielding layer.

6. The array substrate according to claim 1, wherein a material of the flexible substrate layer is polyimide.

7. The array substrate according to claim 1, further comprising a supporting layer located on the pixel definition layer.

8. An array substrate, a bending region and a non-bending region defined in the array substrate, the array substrate comprising:
- a flexible substrate layer;
- a composite buffer layer, located on the flexible substrate layer;
- a source drain layer, located on the composite buffer layer;
- a flattening layer, located on the source drain layer; and
- a pixel definition layer, located on the flattening layer,
- wherein thickness of the composite buffer layer located in the bending region is less than thickness of the composite buffer layer located in the non-bending region,
- wherein the array substrate further comprises a light emitting layer on the pixel definition layer in the non-bending region.

9. A display panel, comprising the array substrate according to claim 1.

* * * * *

UNITED STATES PATENT AND TRADEMARK OFFICE
CERTIFICATE OF CORRECTION

| | | |
|---|---|---|
| PATENT NO. | : 11,094,770 B2 | Page 1 of 1 |
| APPLICATION NO. | : 16/639755 | |
| DATED | : August 17, 2021 | |
| INVENTOR(S) | : Yang Zhou | |

It is certified that error appears in the above-identified patent and that said Letters Patent is hereby corrected as shown below:

On the Title Page

Item (30), add:
Foreign Application Priority Data
Aug. 20, 2019 (CN)............................. 201910767787.7

Signed and Sealed this
Second Day of August, 2022

Katherine Kelly Vidal
*Director of the United States Patent and Trademark Office*